US 8,357,874 B2

(12) United States Patent
Kirchmeier et al.

(10) Patent No.: US 8,357,874 B2
(45) Date of Patent: Jan. 22, 2013

(54) RADIO FREQUENCY POWER SUPPLY

(75) Inventors: Thomas Kirchmeier, Teningen (DE); Hans-Juergen Windisch, Ehrenkirchen (DE); Hanns-Joachim Knaus, Emmendingen (DE); Michael Glueck, Freiburg (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 1115 days.

(21) Appl. No.: 12/178,372

(22) Filed: Jul. 23, 2008

(65) Prior Publication Data

US 2009/0026181 A1    Jan. 29, 2009

Related U.S. Application Data

(60) Provisional application No. 60/951,392, filed on Jul. 23, 2007.

(30) Foreign Application Priority Data

Jun. 11, 2008 (WO) .................. PCT/EP2008/004651

(51) Int. Cl.
*B23K 10/00* (2006.01)
(52) U.S. Cl. .............. 219/121.54; 219/121.57; 219/499; 315/111.51
(58) Field of Classification Search ............ 219/121.54, 219/121.57, 499, 121.43, 121.48; 365/56.01; 315/111.51; 156/345.44
See application file for complete search history.

(56) References Cited

U.S. PATENT DOCUMENTS

| 3,820,008 | A | 6/1974 | Guarnaschelli |
| 4,053,848 | A | 10/1977 | Kleische |
| 4,215,392 | A | 7/1980 | Rhoads |
| 4,490,684 | A | 12/1984 | Epsom et al. |
| 4,656,434 | A | 4/1987 | Selin |
| 4,701,716 | A | 10/1987 | Poole |
| 4,758,941 | A | 7/1988 | Felton et al. |
| 4,860,189 | A | 8/1989 | Hitchcock |
| 4,910,452 | A | 3/1990 | Dickens et al. |
| 4,921,357 | A | 5/1990 | Karube et al. |

(Continued)

FOREIGN PATENT DOCUMENTS

EP    0073059    3/1983

(Continued)

OTHER PUBLICATIONS

De Vries et al., "Solid State Class DE RF Power Source", Proc. IEEE International Symposium on Industrial Electronics (ISIE'98), vol. 2, pp. 524-529, Pretoria, South Africa, Jul. 1988.

(Continued)

*Primary Examiner* — Mark Paschall
(74) *Attorney, Agent, or Firm* — Fish & Richardson P.C.

(57) ABSTRACT

A plasma supply device includes a full bridge circuit that is connected to a DC power supply and that has two half bridges each with two series connected switching elements. The plasma supply device further includes a primary winding of a power transformer connected to centers of the half bridges between the switching elements. The primary winding includes a tapping connectable to an alternating current center between the potentials of the DC power supply.

20 Claims, 9 Drawing Sheets

U.S. PATENT DOCUMENTS

| | | | |
|---|---|---|---|
| 4,980,810 A | 12/1990 | McClanahan et al. | |
| 5,195,045 A | 3/1993 | Keane et al. | |
| 5,222,246 A | 6/1993 | Wolkstein | |
| 5,225,687 A | 7/1993 | Jason | |
| 5,363,020 A | 11/1994 | Chen et al. | |
| 5,382,344 A | 1/1995 | Hosokawa et al. | |
| 5,394,061 A | 2/1995 | Fujii | |
| 5,424,691 A | 6/1995 | Sadinsky | |
| 5,434,527 A | 7/1995 | Antone | |
| 5,435,881 A | 7/1995 | Ogle | |
| 5,438,498 A | 8/1995 | Ingemi | |
| 5,523,955 A | 6/1996 | Heckman | |
| 5,563,775 A | 10/1996 | Kammiller | |
| 5,574,410 A | 11/1996 | Collins et al. | |
| 5,610,452 A | 3/1997 | Shimer et al. | |
| 5,635,762 A | 6/1997 | Gamand | |
| 5,810,963 A | 9/1998 | Tomioka | |
| 5,875,103 A | 2/1999 | Bhagwat et al. | |
| 5,944,942 A | 8/1999 | Ogle | |
| 6,038,142 A | 3/2000 | Fraidlin et al. | |
| 6,084,787 A | 7/2000 | Nyberg et al. | |
| 6,130,831 A | 10/2000 | Matsunaga | |
| 6,229,718 B1 | 5/2001 | Nilssen | |
| 6,246,599 B1 | 6/2001 | Jang et al. | |
| 6,297,696 B1 | 10/2001 | Abdollahian et al. | |
| 6,344,768 B1* | 2/2002 | Daun-Lindberg et al. | 327/424 |
| 6,365,868 B1 | 4/2002 | Borowy et al. | |
| 6,703,080 B2 | 3/2004 | Reyzelman et al. | |
| 6,704,203 B2 | 3/2004 | Chapuis et al. | |
| 6,760,234 B2 | 7/2004 | Yuzurihara et al. | |
| 6,777,881 B2 | 8/2004 | Yuzurihara et al. | |
| 6,791,851 B2 | 9/2004 | Brkovic | |
| 6,909,617 B1* | 6/2005 | Mirskiy | 363/17 |
| 6,992,902 B2 | 1/2006 | Jang et al. | |
| 6,996,892 B1 | 2/2006 | Dening et al. | |
| 7,138,861 B2 | 11/2006 | Sundström et al. | |
| 7,161,818 B2* | 1/2007 | Kirchmeier et al. | 363/132 |
| 7,244,343 B2 | 7/2007 | Watanabe et al. | |
| 7,259,623 B2 | 8/2007 | Coleman | |
| 7,312,584 B2 | 12/2007 | Tamita et al. | |
| 7,333,348 B2 | 2/2008 | Horiuchi et al. | |
| 7,353,771 B2 | 4/2008 | Millner et al. | |
| 7,403,400 B2 | 7/2008 | Stanley | |
| 7,452,443 B2 | 11/2008 | Glueck et al. | |
| 7,616,462 B2 | 11/2009 | Millner et al. | |
| 7,755,300 B2 | 7/2010 | Kishinevsky et al. | |
| 7,796,005 B2 | 9/2010 | Blankenship et al. | |
| 7,872,523 B2 | 1/2011 | Sivakumar et al. | |
| 7,884,590 B2 | 2/2011 | Liu | |
| 2003/0215373 A1 | 11/2003 | Reyzelman et al. | |
| 2004/0031566 A1 | 2/2004 | Takahashi et al. | |
| 2004/0105288 A1 | 6/2004 | Watanabe et al. | |
| 2004/0114399 A1 | 6/2004 | Lincoln et al. | |
| 2005/0088231 A1 | 4/2005 | Ziegler | |
| 2005/0088855 A1 | 4/2005 | Kirchmeier et al. | |
| 2005/0122087 A1 | 6/2005 | Sakai et al. | |
| 2005/0255809 A1 | 11/2005 | Glueck | |
| 2006/0158911 A1* | 7/2006 | Lincoln et al. | 363/56.01 |
| 2006/0191880 A1 | 8/2006 | Kwon et al. | |
| 2006/0196426 A1 | 9/2006 | Gluck et al. | |
| 2006/0252283 A1 | 11/2006 | Takeda et al. | |
| 2007/0121267 A1 | 5/2007 | Kotani et al. | |
| 2007/0145900 A1 | 6/2007 | Kirchmeier et al. | |
| 2009/0153127 A1 | 6/2009 | Chen | |

FOREIGN PATENT DOCUMENTS

| | | |
|---|---|---|
| EP | 1 272 014 | 1/2003 |
| EP | 1783904 | 10/2005 |
| EP | 1 701 376 | 9/2006 |
| EP | 1701376 | 9/2006 |
| EP | 1 783 904 | 5/2007 |
| JP | 55082967 | 6/1980 |
| JP | 9120910 A | 5/1997 |
| JP | 10214698 A | 8/1998 |
| JP | 2001185443 A | 7/2001 |
| JP | 2002237419 A | 8/2002 |
| JP | 2005086622 A | 3/2005 |
| JP | 2006165438 A | 6/2006 |
| WO | 9749267 | 12/1997 |
| WO | 9857406 | 12/1998 |
| WO | 2005094138 | 6/2005 |

OTHER PUBLICATIONS

Walker et al., "An Isolated MOSFET Gate Driver". Australasian Universities Power Engineering Conference, AUPEC'96, 1996, vol. 1, Melbourne, pp. 175-180.

* cited by examiner

RADIO FREQUENCY POWER SUPPLY

CROSS REFERENCE TO RELATED APPLICATIONS

This application claims priority under 35 U.S.C. §119(e) to U.S. Patent No. 60/951,392, filed on Jul. 23, 2007 and under 35 U.S.C. §119(a) to PCT/EP2008/004651, filed on Jun. 11, 2008. Both of these priority applications are hereby incorporated by reference in their entirety.

TECHNICAL FIELD

The invention relates to a plasma supply device with a full bridge circuit connected to a direct current power supply.

BACKGROUND

A plasma supply device is a plasma power supply that supplies plasma processes with electrical power. The plasma supply device operates at a basic frequency that, when used as a plasma power supply, should only deviate slightly from a theoretical value. Typical basic frequencies are 3.39 MHz, 13.56 MHz, 27 MHz, 40 MHz, and 62 MHz.

A plasma is a special aggregate state that is produced from a gas. Every gas consists in principle of atoms and/or molecules. In the case of a plasma, the gas is largely ionized, which means that the atoms and/or molecules are split into positive and negative charge carriers, i.e., into ions and electrons, due to the supply of energy. A plasma is suitable for processing workpieces because the electrically charged particles are chemically highly reactive and can also be influenced by electrical fields. The charged particles can be accelerated by means of an electrical field on a workpiece, where they can release individual atoms from the workpiece on collision.

The released atoms can be removed by gas flow (etching) or deposited on other workpieces (production of thin films). A plasma can be used to deposit extremely thin layers, for example, in the region of few atom layers. Typical applications for plasma processing are semiconductor technology (coating, etching, etc.), flat screens (similar to semiconductor technology), solar cells (similar to semiconductor technology), architectural glass coating (heat protection, dazzling protection, etc.), storage media (CD, DVD, hard discs), decorative coatings (colored glasses, etc.) and tool hardening. These applications impose high demands in terms of accuracy and process stability.

A plasma can also serve to excite lasers, particularly gas lasers.

To generate a plasma from a gas, energy is supplied to the gas. Energy can be supplied in different ways, for example, as light, heat, or electrical energy. Moreover, a plasma can be ignited with the electrical energy. A plasma for processing workpieces is typically ignited in a plasma chamber, for which purpose an inert gas, e.g., argon, is generally filled into the plasma chamber at low pressure. The gas is exposed to an electrical field that is produced by electrodes and/or antennae.

A plasma is generated or is ignited when several conditions are met. A small number of free charge carriers must be present, and in most cases use is made of the free electrons that are always present to a small extent. The free charge carriers are accelerated so much by the electrical field that they create additional electrons when colliding with atoms or molecules of the inert gas, thus producing positively charged ions and additional electrons. The additional free charge carriers are again accelerated and on collision produce further ions and electrons. An avalanche effect is created. The natural recombination counteracts the constant generation of ions and electrons, i.e., electrons are attracted by ions and recombine to form electrically neutral atoms and/or molecules. Therefore energy is constantly supplied to an ignited plasma in order to maintain the plasma.

SUMMARY

In a plasma supply device, a full bridge circuit connected to a direct current power supply includes switching elements each connected in series and a primary winding of a power transformer connected to the centers of the half bridges between the switching elements. When operating such a full bridge with four switching elements, zero-voltage switching is carried out for some of the switching elements and the power is regulated by phase shifting.

Thus, in some embodiments of such a plasma supply device, zero-voltage switching can be achieved in various operating states.

In one aspect, a plasma supply device includes a full bridge circuit connectable to a DC power supply, the full bridge including two half bridges, each half bridge including two switching elements connected in series at a center between the switching elements, and a power transformer with a primary winding connected to the centers of the half bridges, wherein the primary winding comprises a tapping connectable to a potential between two potentials of the DC power supply.

In another aspect, a method for operating a plasma supply device including a DC power supply, a full bridge with four switching elements, and a power transformer connected to the full bridge and including a primary winding with a tapping, includes zero-voltage switching of at least some of the switching elements, regulating a power by phase shifting, providing an alternating current center between potentials of the DC power supply, and applying the alternating current center to the tapping of the primary winding.

In another aspect, a plasma supply device includes a primary winding having a tapping, which divides the primary winding in two. To the tapping is connected a potential which lies between the two potentials of the DC power supply. This potential, which is referred to in the following as an auxiliary potential, is located between the potentials of the DC power supply, thus a current can flow through the primary winding even at a 0° phase shift of the half bridges. In some implementations, the auxiliary potential can be located midway between the potentials of the DC power supply. The voltage generated during disconnection by the self induction in the primary winding can again be so high that the end of the primary winding to be connected to the DC power supply encounters the potential of the DC power supply to be connected. Zero-voltage switching can therefore be achieved.

The tapping of the primary winding can be provided in the center of the primary winding, thereby achieving symmetrical, uniform behavior for both half bridges.

The auxiliary potential can be obtained by a voltage divider, where the ends of the voltage divider are connected to the potentials of the DC power supply and a third connection is made to the tapping. Due to the alternating switching of the two primary winding ends to the two potentials of the DC power supply, the potential of the tapping can also vary and an alternating current can be generated through the tapping. Therefore, it can even be sufficient to obtain the auxiliary potential by a capacitive voltage divider based on the alternating current.

It is even possible to bring the tapping to an (auxiliary) potential between the potentials of the DC power supply solely by connecting the tapping via a component, e.g., a capacitor, to a potential of the DC power supply, where there is alternating disconnection of the two primary winding ends at both potentials of the DC power supply.

The voltage divider can be constructed from a plurality of capacitors or resistors. For example, one can use two identically dimensioned capacitors or two identically dimensioned resistors. The auxiliary potential is then provided between the two capacitors or resistors. A buffer circuit, which enables a current to flow for a certain time via the tapping, can also be considered to be a voltage divider.

At a phase shift of 180°, there is hardly any voltage at the tapping relative to the center of the DC power supply. No current therefore flows and the tapping does not cause an additional loading of the primary winding.

Opposite currents that are generated in the two parts of the primary winding at a phase shift other than 180° reduce the self inductance of the primary winding. This effect is larger the closer the phase shift approaches the value of 0° and the better the two parts of the primary winding are magnetically coupled to each other. Therefore, a first inductance can be switched between the auxiliary potential of the DC power supply and the tapping and provide an additional inductive action.

Under other conditions, for example at high (parasitic) inductances in the circuit supplying the auxiliary potential, or in the supply line to the tapping, the connection of a capacitor between the auxiliary potential and the tapping can be advantageous.

If an oscillatory circuit is connected between the auxiliary potential and the tapping, the oscillatory circuit can be adapted to provide an optimum functionality, e.g. zero-voltage switching for a wide power range.

In some embodiments, an auxiliary inductance can be connected between at least one center point of the half bridges and the respective connection of the primary winding. Instead of a single auxiliary inductance, a plurality of auxiliary inductances can be connected in series between the primary winding and the half bridges. This can be particularly advantageous when the remaining reactance of the primary winding is inadequate for a sufficiently high inductance at full load.

If the current flowing through the primary winding of the power transformer is too low without a load, an auxiliary inductance can be connected in parallel to the primary winding.

In some embodiments, it is possible to operate plasma supply devices at frequencies of greater than about 3 MHz and at a DC power supply voltage of greater than about 100 volts.

To be able to operate a plasma, for example, for producing flat screens, it can be advantageous if a power greater than 10 kW can be generated with the plasma supply device.

In another aspect, a method provides an alternating current center between the potentials of the DC power supply to a tapping of a primary winding of a power transformer connected to the full bridge; thereby zero-voltage switching can be ensured over a wide power regulating range. Moreover, losses and hence heating of the plasma supply device can be reduced.

To achieve symmetrical behavior, the alternating current center can be applied to the center of the primary winding. In this case, the alternating current center can be applied by a coil or an oscillatory circuit to the tapping of the primary winding. Such an oscillatory circuit can be adapted as required.

The AC center can be provided in various ways; for example, in form of a voltage divider made of capacitors. Bypass capacitors of the half bridges forming the full bridge can also be used as voltage dividers.

A power of greater than about 10 kW can be generated with the plasma supply device.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference symbols in the various drawings indicate like elements.

DETAILED DESCRIPTION

Figure 1:
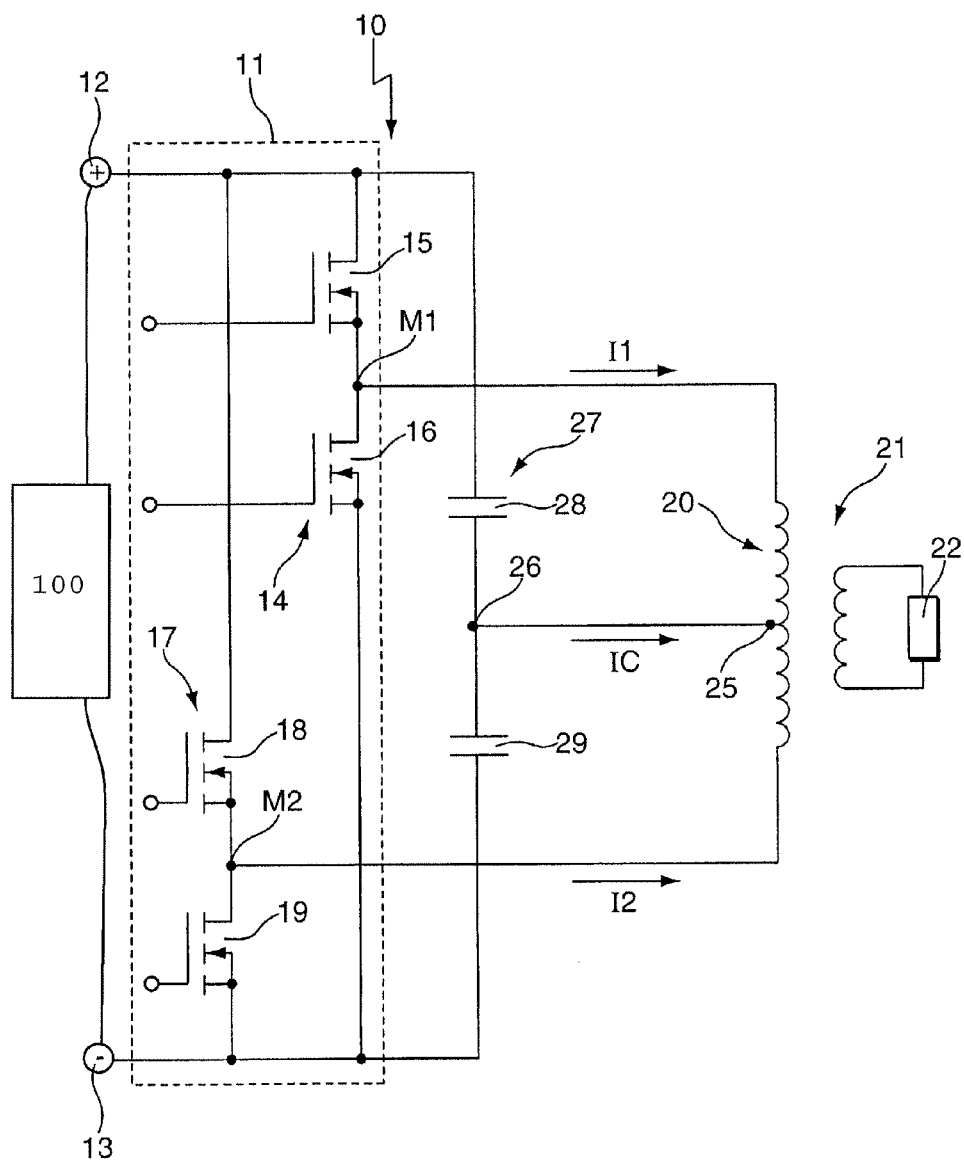
FIG. 1 is a circuit diagram of a plasma supply device with a full bridge and a power transformer whose primary winding has a tapping.

A radio frequency (RF) signal, which ignites and maintains the plasma process, e.g., a high frequency signal, can be generated with a switch bridge, which has at least two switching elements (also referred to in the following as switch elements or switches). Switch bridges or bridge branches are commonly used in half bridge or full bride circuits in various applications of power electronics, e.g., switch-mode power supplies, current supplies or amplifiers. Such circuits are also known as class D amplifiers.

The switching elements of a switch bridge can be, e.g., metal oxide semiconductor field-effect transistors (MOSFETs), which are connected in series; the connection point of the switching elements represents the center of the switch bridge. By the two switching elements, the center of the bridge branch can be connected alternately to the positive or negative pole of a direct current power supply. The control of the two switching elements and of additional switching elements of a second bridge branch is provided by a control voltage source that can include an oscillator, which determines the frequency of the output signal, and additional components such as inverters, phase shifters and signal formers.

A full bridge circuit consists of two bridge branches (half bridges) whose centers are inversely connected at the desired frequency to the positive and negative pole of the DC voltage supply. The alternating current load is arranged between these two centers. An additional capacitor for releasing the output signal from a DC voltage portion is not necessary.

Switching elements can be made of semiconductor components. In the described embodiments, exemplary semiconductor components can include, for example, bipolar power transistors, MOSFETs, IGBTs and thyristors, although mainly the use of MOSFETs is described.

MOSFETs can be capable to switch higher currents with less power dissipation. The MOSFETs control the drain-source section as a function of the gate-source voltage, i.e., the source connection is the electrical reference potential of the component.

Based on different dopings, there are two types of MOSFETs, the P-channel MOSFET and the N-channel MOSFET. Based on its low resistance properties in the conducting state, an N-channel MOSFET can be considered more suitable for high power bridge circuits than a P-channel MOSFET, which tolerates less current and has a higher power loss.

To avoid switching losses when individual switching elements of a full bridge are turned on, there should be no appreciable voltage difference between the two power electrodes (generally drain and source) of the MOSFET. Such a switching behavior is called zero-voltage switching, and can be achieved by using the self-induction of a primary winding of a power transformer connected to the centers of the two half bridges of the full bridge. When one of the half bridges interrupts the current through the primary winding by switching off a pole of the DC source from its end of the primary winding a voltage is induced at this end.

Suitably dimensioned components, considering parasitic characteristics, and choosing correct switching/waiting times can provide that the potential at the end of the primary winding, which has been disconnected from one pole of the DC power supply is then exactly as high as the potential of the other pole of the DC power supply, which is to be switched to this end of the primary winding with the half bridge.

However, zero-voltage switching cannot always be maintained and can be affected, for example, when the power is controlled by phase shifting.

Controlling the power by phase shifting shifts the phases of the voltages that are applied to both ends of the primary winding. In the case of a phase shift of 180° of the two half bridges, a maximum current can be always achieved and a maximum power is supplied by the full bridge. In the case of a 90° shift, current can only flow for approx. ¾ of the time. In the case of a 0° phase shift, current does not flow because the series connections of the primary winding are pulled to the same potential by both half bridges. As there is no self induction without current, there is also no zero-voltage switching.

FIG. 1 shows a plasma supply device with which zero-voltage switching can be achieved in various operating states. Specifically, FIG. 1 shows a plasma supply device 10 with a full bridge 11, which is connected to a DC power supply 100 with a positive potential 12 and a negative potential 13. The full bridge 11 has a first half bridge 14 with switching elements 15, 16, where the switching element 15 is connected to the positive potential 12 and the switching element 16 is connected to the negative potential 13. The switching elements 14, 15 are connected in series. A center of the half bridge 14 is denoted by M1. The full bridge 11 also has a second half bridge 17 with switching elements 18, 19. The half bridge 17 is also connected to the positive potential 12 and the negative potential 13. A center between switching elements 18, 19 connected in series is denoted by M2. The centers M1, M2 represent the output of the full bridge 11.

The centers M1, M2 are connected to a primary winding 20 of a power transformer 21. A load 22 is in turn connected to the power transformer 21, this schematically shown (complex) impedance can, for example, be a plasma load.

The centers M1, M2 are connected to the positive and negative potentials 12 and 13 of the DC power supply 100 with a desired frequency, in particular, a basic frequency, generally in opposite directions. A current flowing from center M1 into the primary winding 20 is denoted by I1. A current flowing from center M2 in the primary winding 20 is denoted by I2. At its center, the primary winding 20 has a tapping 25 that is connected to a point 26. The point 26 is the third connection of a capacitive voltage divider 27 that is connected to the potentials 12 and 13 of the DC power supply 100 and, in the shown configuration, includes two capacitors 28, 29, which are of the same dimension. The point 26 between the capacitors 28, 29 defines an auxiliary potential that is located at the alternating current center between the potentials 12 and 13 of the DC power supply 100. A current from alternating current center 26 to the tapping 25 is denoted by IC.

The mode of operation of the arrangement shown in FIG. 1 is explained in connection with FIG. 6-9.

Figure 2:
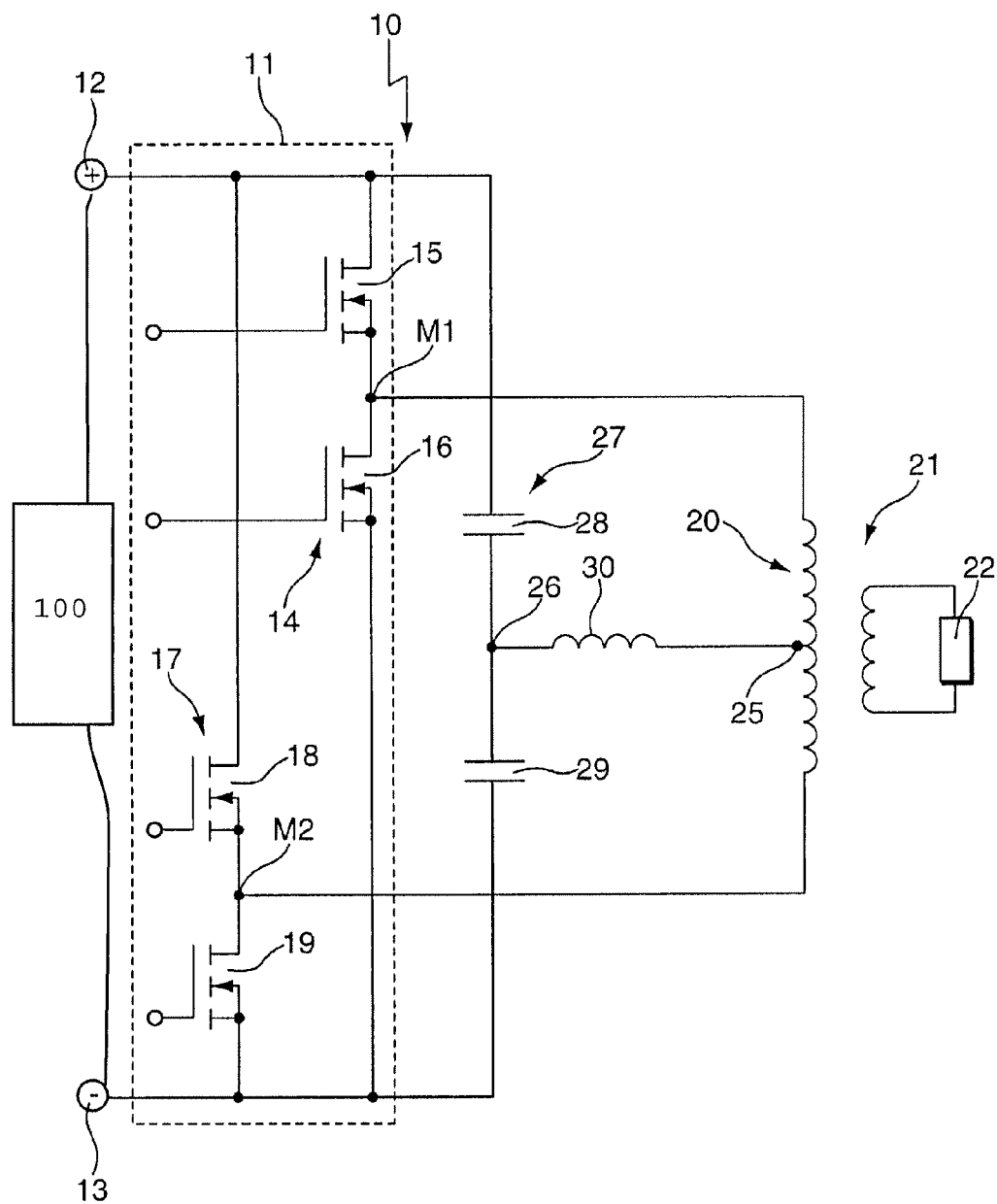
FIG. 2 is a circuit diagram of a plasma with an inductance between a tapping of a primary winding of a power transformer and an alternating current center between potentials of a DC power supply.

FIG. 2 corresponds essentially to FIG. 1, with the difference that an inductance 30 is provided between the point 26 and the tapping 25. If currents flowing in opposite directions in both parts of the primary winding 20 are generated at a phase shift other than 180°, the self inductance of the primary winding 20 is reduced. This effect is larger the closer the phase shift approaches the value of 0°, and the better the parts of the primary winding 20 are magnetically coupled together. A first inductance 30 can therefore be connected between the auxiliary potential of the DC power supply 100 and the tapping, and can provide an additional inductive action.

Figure 3:
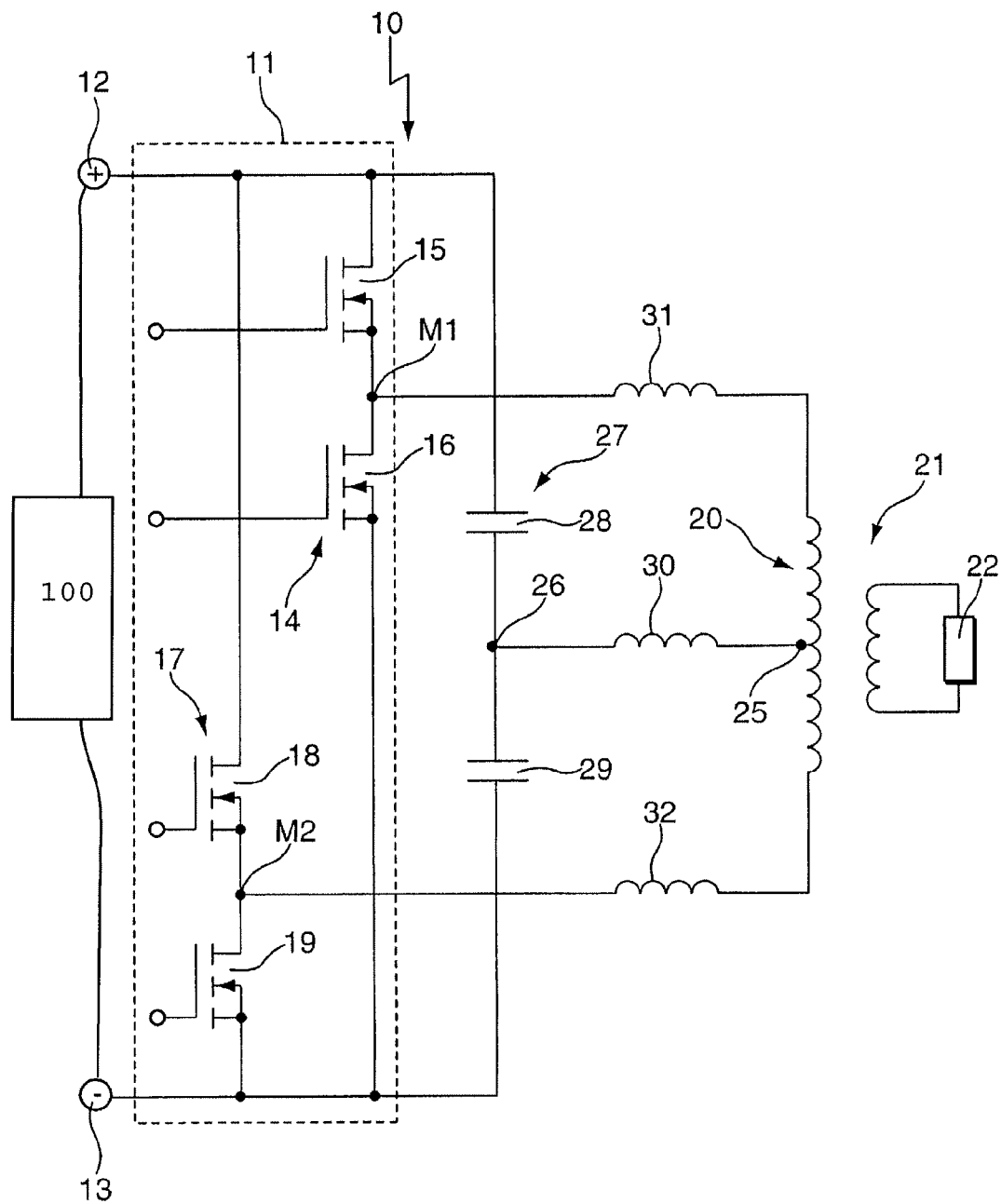
FIG. 3 is a circuit diagram of a plasma supply device as shown in FIG. 2, with additional inductances connected in series to the primary winding of the power transformer.

In the configuration of FIG. 3, two additional inductances 31, 32 are provided, compared to FIG. 2, the inductance 31 being connected between the center M1 and the primary winding 20, and the inductance 32 being connected between the center M2 and the primary winding 20. The inductance of the primary winding 20 can therefore be supported by the inductances 31, 32, thus ensuring that zero-voltage switching takes place.

Figure 4:
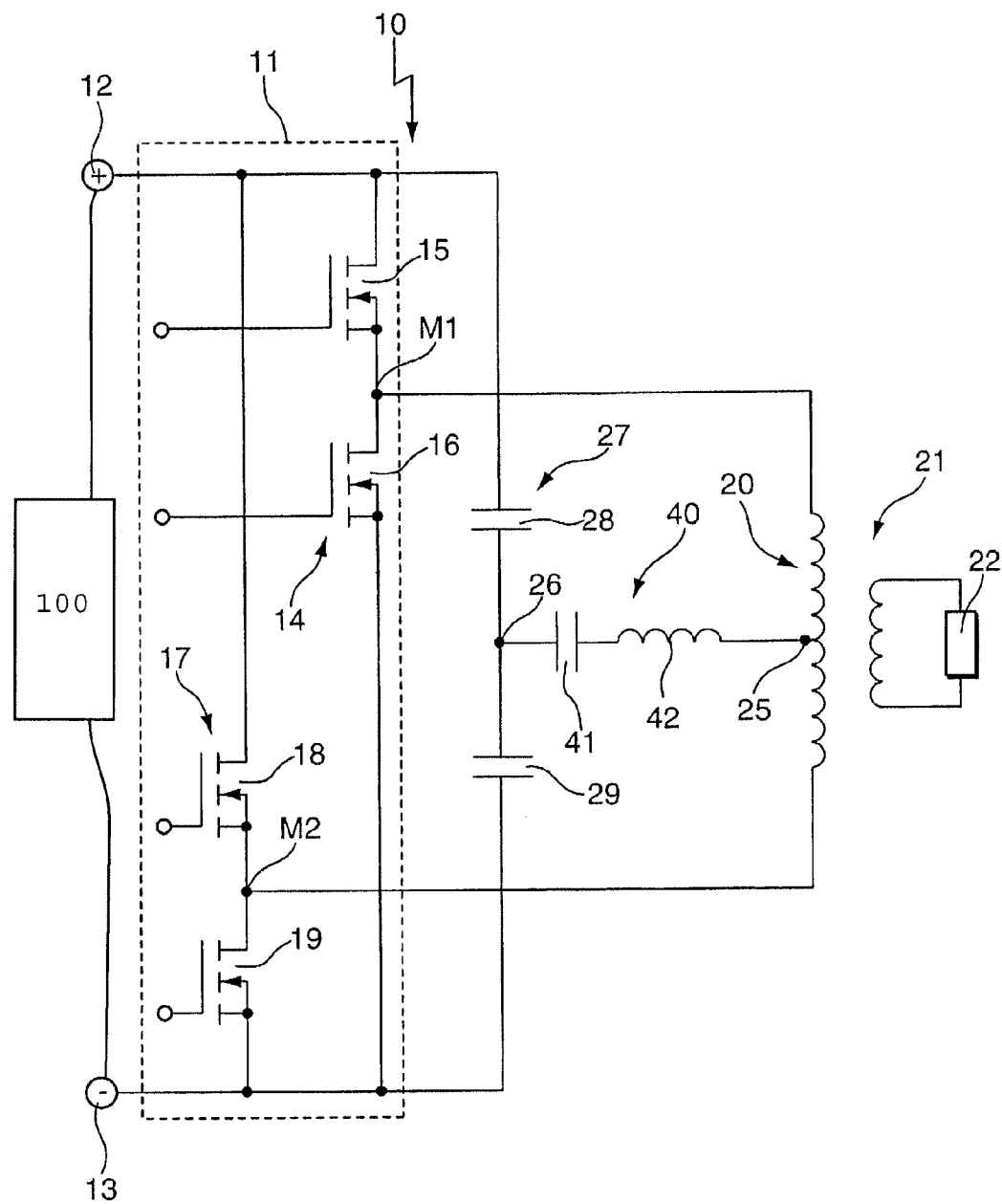
FIG. 4 is a circuit diagram of a plasma supply device with an oscillatory circuit between a tapping of a primary winding of the power transformer and an alternating current center between potentials of a DC power supply.

In the plasma supply device of FIG. 4, an oscillatory circuit 40 is provided between the point 26 and the tapping 25, which oscillatory circuit 40 includes a capacitor 41 and a coil 42. The oscillatory circuit 40 can be adapted as required in order to achieve optimum or improved zero-voltage switching for as many operating states as possible.

Figure 5:
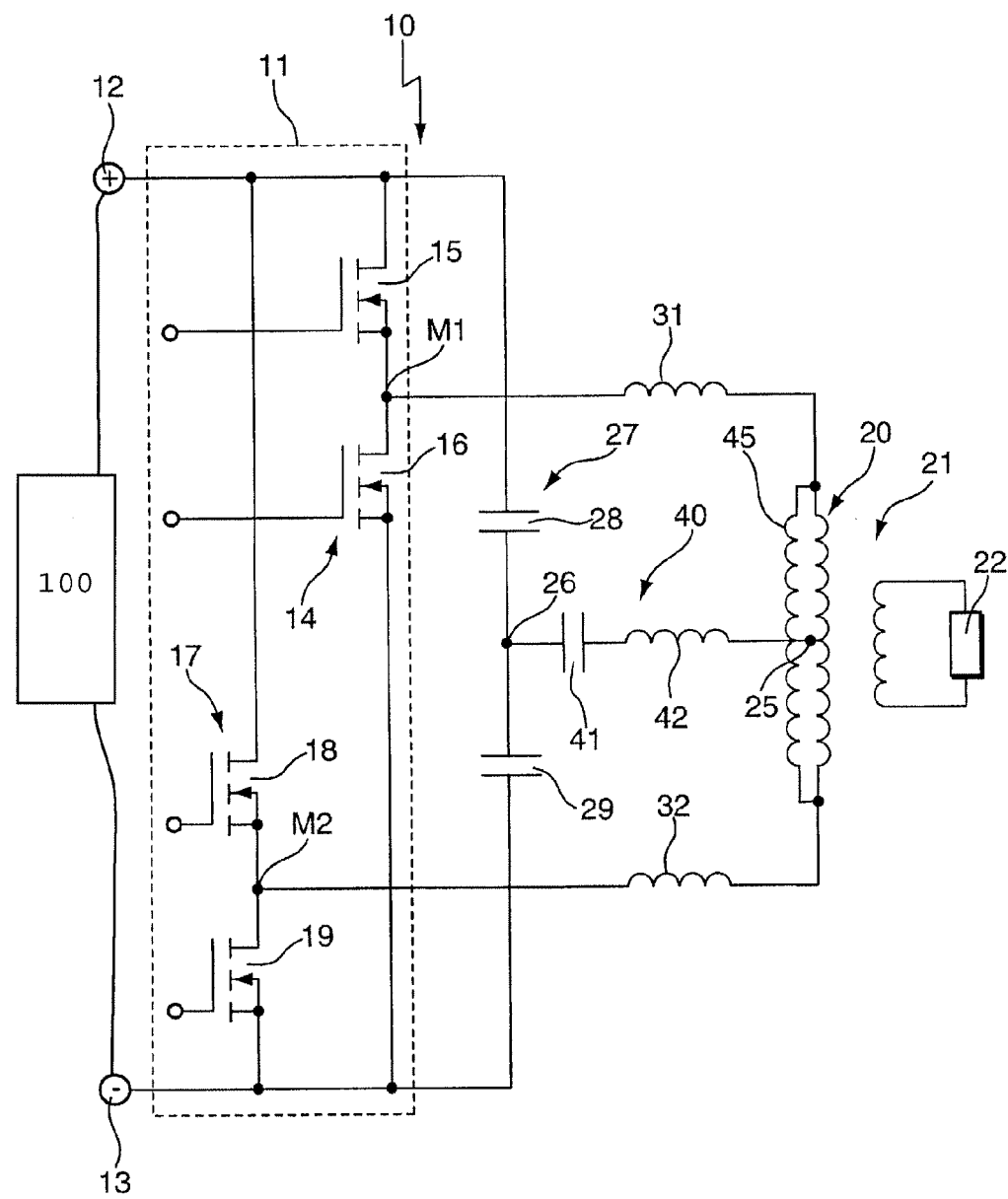
FIG. 5 is a circuit diagram of a plasma supply device as shown in FIG. 3, with an oscillatory circuit as shown in FIG. 4.

In the case of the embodiment shown in FIG. 5, series inductances 31, 32 are provided in addition to the configuration of FIG. 4. Moreover, a further auxiliary inductance 45 is provided parallel to the primary winding 20. The auxiliary inductance 45 can be advantageous when the current flowing through the primary winding 20 is too low without an at least partially active load.

Figure 6:
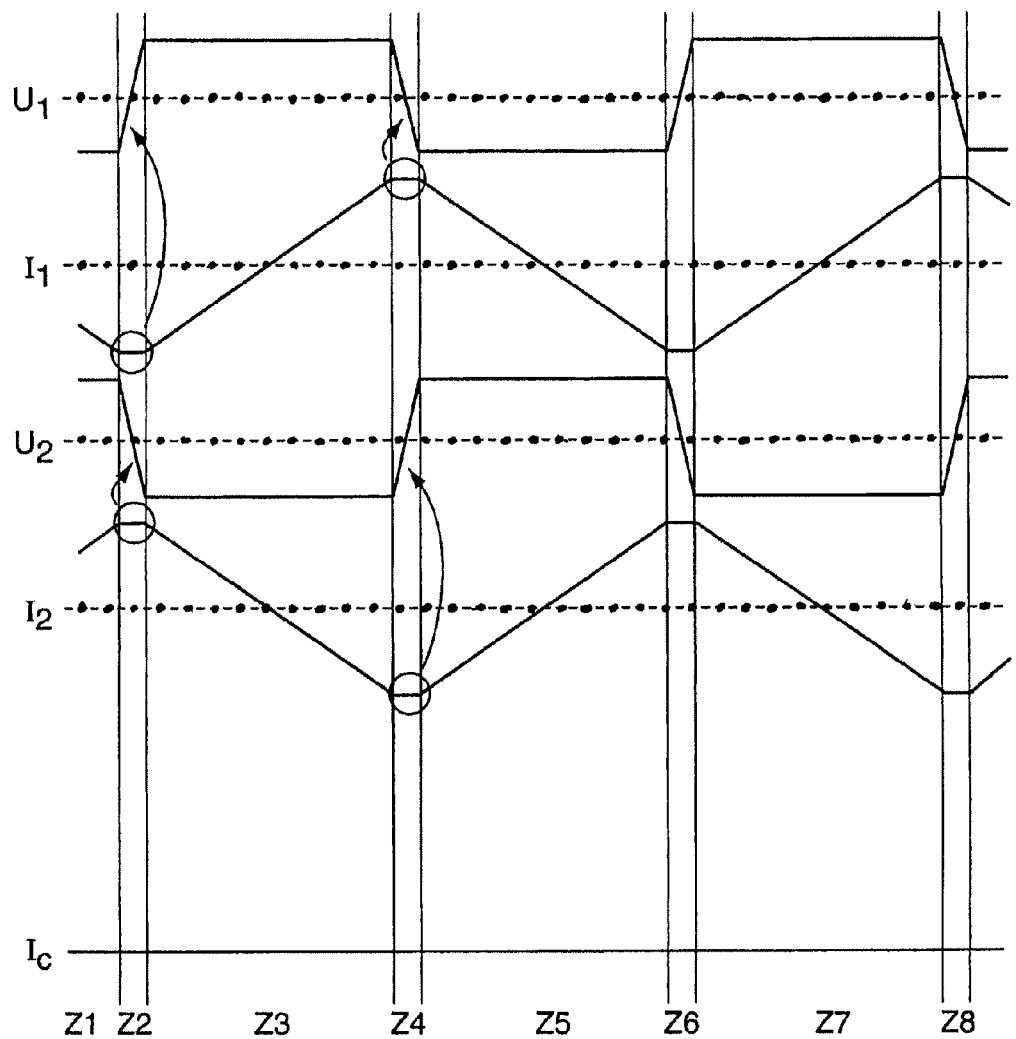
FIG. 6 is a graph illustrating the behavior of a full bridge at a phase shift of 180° between its half bridges.

The temporal characteristic for the two half bridges 15, 17 operated with a relative 180° phase shift is illustrated in the graph of FIG. 6, which shows voltage and current values versus time.

The time is plotted on the X-axis, showing eight different states Z1 to Z8. The states Z2, Z4, Z6 and Z8 are shown in an enlarged time scale to clarify the processes. The processes that take place during states Z2, Z4, Z6 and Z8 are actually very fast processes.

A voltage U1 is the voltage between the switching elements 15 and 16 of the first half bridge 14 at the point M1. A positive current I1 is indicated in FIG. 1. A positive current I1 is therefore the current that flows into the primary winding 20. A negative current I1 flows from the primary winding 20 to the center M1.

A voltage U2 is accordingly the voltage at the center M2 between the switching elements 18 and 19 of the second half bridge 17. A positive current I2 is also shown in FIG. 1 and corresponds to a current which flows from the center M2 into the primary winding 20. A negative current I2 flows correspondingly from the primary winding 20 to the center M2. The current IC is the current that flows from the point 26 to the tapping 25 of the primary winding 20.

In state Z1, the switching element 16 is switched on and the switching element 15 is switched off. Correspondingly, the negative potential 13 of the DC power supply is applied to the center M1. In the half bridge 17, the switching element 18 is switched on and the switching element 19 is switched off. Correspondingly, the positive potential 12 of the DC power supply 100 is present at the center M2. The current I1 reaches its negative maximum at the end of the state Z1. The current I2 reaches its positive maximum at the end of the state Z1, and the current IC is not present at the tapping 25. During the state Z2, which is very short, all switching elements 15, 16, 18, and 19 are switched off. Therefore, no potential 12 and 13 of the DC power supply 100 is connected to the primary winding 20.

Because of the self induction of the primary winding 20, the current I1 or I2 tends to continue to flow, thus inducing a voltage that causes the voltage U1 to jump at the center M1 to the positive potential 12 of the DC power supply 100 and causing the voltage at the lower end of the primary winding 20, or at the point M2, to jump to the negative potential 13 of the DC power supply 100. The parasitic impedances, particularly the parasitic capacitances of the actual components, above all those of the MOSFETs, prevent voltages of any levels from being generated; instead the level of the induced voltage can be set by a suitable choice of the time periods Z2, Z4 etc. If the switching element 15 and the switching element 19 are switched off (closed) for the state Z3 at the end of the time period Z2, no voltage is applied via the switching elements 15 and 19, so that switching takes place at 0 V. This switching therefore takes place without loss.

During the state Z3, there is a reversal of the flow direction of the currents I1 and I2, so that the current I1 reaches its positive maximum at the end of the state Z3, and correspondingly the current I2 reaches its negative maximum at the end of the state Z3. In the subsequent state Z4, all the switching elements 15, 16, 18, and 19 are again switched off. Since the current continues to be driven by the primary winding 20, a voltage is again induced so that the voltage U1 jumps from its positive maximum to its negative maximum, namely the negative potential 13 of the DC power supply 100. Correspondingly, the voltage U2 jumps to its positive maximum, which corresponds to the positive potential 12 of the DC power supply 100.

The state Z5 corresponds to the state Z1. The negative supply potential 13 is applied to the point M1 and the positive supply potential 12 is applied to the point M2, because the switching elements 16 and 18 are switched on and the switching elements 15 and 19 are switched off. The state Z6 corresponds to the state Z2 and the state Z7 corresponds to the state Z3. The state Z8 corresponds to the state Z4.

It can be seen that during all the states, the current IC is zero and unchanged, which means that at a phase shift of 180° no current flows through the tapping 25 and the tapping 25 has practically no effect.

Figure 7:
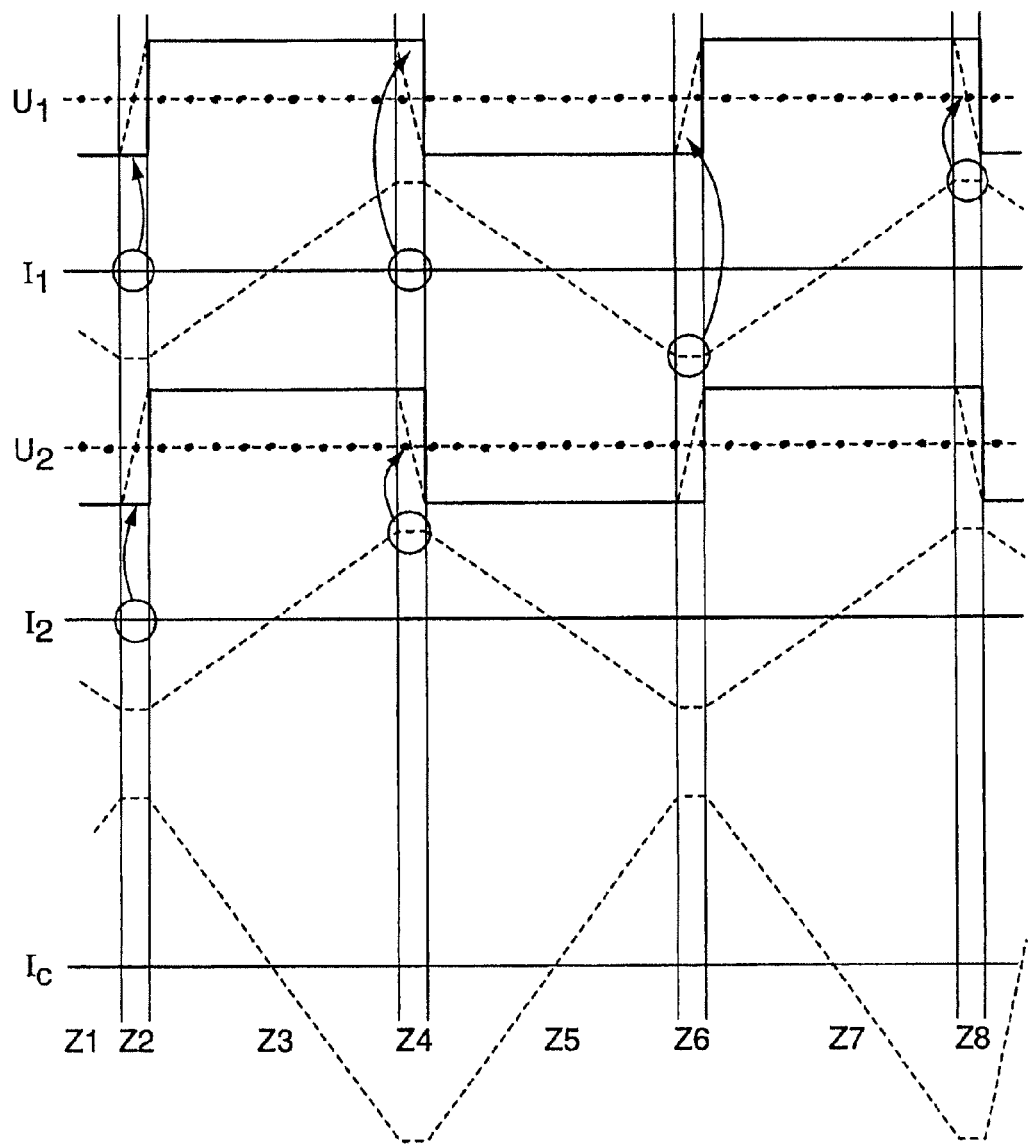
FIG. 7 is a graph illustrating states of a full bridge at a phase shift of 0° between its half bridges with and without tapping of a primary winding of a power transformer.

A phase shift of 0° is shown in FIG. 7. The situation, which occurs when the primary winding 20 has no tapping 25, is denoted by the solid lines in the graph. The situation in which the tapping 25 is present, which is connected to an alternating current center of the DC power supply 100, is shown by dashed lines. Dashed-dotted lines indicate constant reference values.

In the state Z1, the switching element 16 and the switching element 19 are switched on and the switching elements 15 and 18 are switched off. This means that the negative potential 13 of the DC power supply 100 is applied both to the center M1 and the center M2.

If no tapping 25 is present, no induction occurs because there is no voltage over the primary winding 20. Correspondingly, the currents I1 and I2 are equal to zero in the state Z1 and in the state Z2, in which all the switching elements 15, 16, 18, 19 are switched off. At the beginning of state Z3, in which the switching elements 15 and 18 are switched on, a voltage jump takes place. This means that there is a high voltage difference over the switching elements 15, 18 when they are switched on. This gives rise to a high power loss.

On the other hand, if the tapping 25 is used, the current I1 flows, reaching its negative minimum at the end of the state Z1. The current I2 also flows, reaching its negative maximum at the end of the state Z1. Both currents flow in opposite directions in both parts of the primary winding 20 from the direction of the tapping 25; they therefore flow in the same direction via the tapping 25. The tapping 25 must therefore absorb the sum of both currents I1, I2, and for this reason the amplitude of the current IC is twice as high as the amplitude of the currents I1 and I2. Because of the currents I1, I2 and the current IC over the tapping 25, the induction becomes effective so that during the state Z2 the voltage U1 jumps from its negative to its positive maximum and the voltage U2 jumps from its negative maximum to its positive maximum. At the time of switching on at the beginning of the state Z3, there is therefore no voltage difference over the switching elements 15, 18, so that these are able to switch on without loss. Here too it should be pointed out that these processes are very fast, but due to the parasitic impedances of actual components, no unsteadiness occurs.

During the state Z3, currents I1, I2 change their sign (as shown by the dashed line). In the state Z4, the voltage U1 or U2 does not vary if no tapping 25 is provided. On the other hand, the voltage does vary because of the induction when the tapping 25 is provided. The voltage U1 jumps to its negative maximum and the voltage U2 also jumps to its negative maximum. This is in turn attributable to the induction due to currents which flow via the tapping 25. In this case, the current I1 flows from the center M1 via the first half of the primary winding 20, the tapping 25 and the point 26. The current I2 flows from the center M2 via the lower part of the primary winding 20, the tapping 25 and the point 26. The state Z5 corresponds in turn to the state Z1, the state Z6 corresponds to the state Z2, the state Z7 corresponds to the state Z3 and the state Z8 corresponds to the state Z4.

Figure 8:
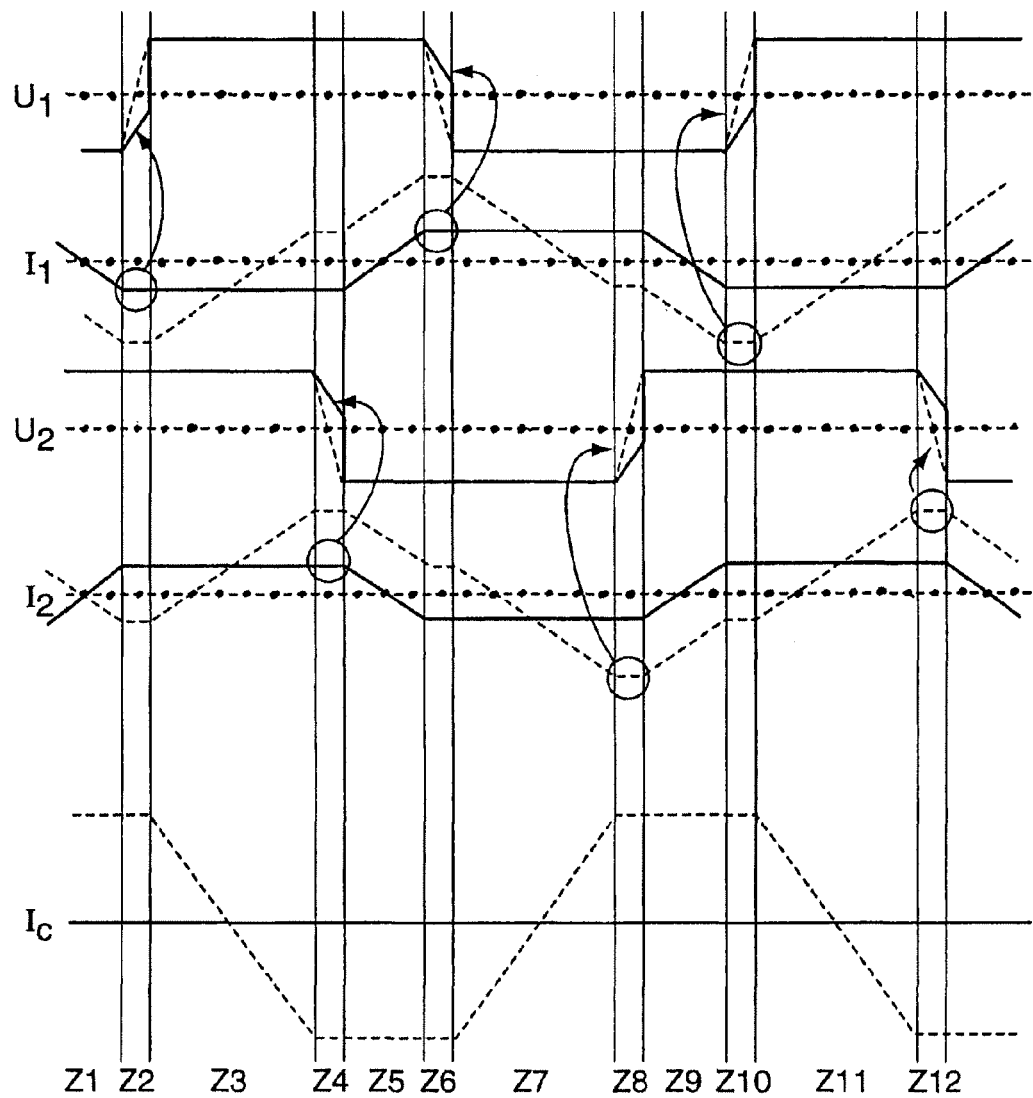
FIG. 8 is a graph illustrating the behavior of a full bridge at a phase shift of 60°.

FIG. 8 illustrates the situation for a phase shift of 60°. In the state Z1, the switching element 15 is switched off and the switching element 16 is switched on, so that the center M1 lies on the negative potential 13 of the DC power supply 100. The switching element 18 is switched on and the switching element 19 is switched off, so that the center M2 is located at the positive potential 12 of the DC power supply 100. The switching element 18 is switched on and the switching element 9 is switched off, so that the center M2 is located at the positive potential 12 of the DC power supply 100. The current I1 without the tapping of the primary winding has a change of sign from positive to negative during the state Z1. However, the current does not reach its negative maximum at the end of the state Z1. The low current I1 is not therefore sufficient to bring the voltage U1 at the center M1 to the positive potential 12 of the DC power supply 100. At the end of the state Z2 the voltage at the center M1 is only about one third of the positive potential 12 of the DC power supply 100. There is therefore a voltage over the switching element 16 when the switching element 16 is switched on, so that this element cannot switch on without loss.

On the other hand, if the central tapping 25 is provided, the current I1 (dashed line) is displaced downwards. It reaches its negative maximum at the end of the state Z1. This current is sufficient to bring the center M1 to the positive potential 12 of the DC power supply 100 due to the induction during the state Z2. At the beginning of state Z3, the switching element 16 is therefore able to switch on without loss. During the state Z2, the switching element 19 remains switched off and the switching element 18 remains switched on.

In the state Z4, the switching element 15 remains switched on, so that the center M1 remains at the positive supply voltage and both switching elements 18, 19 are switched off. If no tapping 25 is present, the low current I2 continues to flow but it is not sufficient to bring the center M2 to the negative potential 13 of the DC power supply 100. At the beginning of the state Z5, switching element therefore switches on under voltage. On the other hand, if the tapping 25 is provided, the current I2 reaches its positive maximum at the end of the state Z3 and a voltage can correspondingly be induced so that the center M2 is brought to the negative potential 13 of the DC power supply 100 during state Z4. This means that at the beginning of the state Z5, the switching element 19 is able to switch on without voltage.

In the state Z6, the switching element 15 is switched off so that both switching elements 15, 16 are switched off. In the second switch bridge 17, there is no variation relative to the state Z5. If no tapping is present, the current I1 is not sufficient to bring the center M1 to the negative potential 13 of the DC power supply 100. This means that at the beginning of the state Z7, the switching element 16 is switched on under voltage.

On the other hand, if the tapping 25 is provided, the current I1 reaches its positive maximum at the end of the state Z5. This current is then sufficient to induce a voltage that corresponds to the negative potential 13 of the DC power supply 100. At the beginning of the state Z7, the switching element 16 can therefore switch on without voltage. In the state Z7, the switching element 16 and the switching element 19 are switched on, and the switching elements 15 and 18 are switched off. The voltages U1 and U2 therefore correspond to the negative potential 13 of the DC power supply 100. The currents I1, I2 have a change of sign if the tapping 25 is present.

On the other hand, if no tapping 25 is present, the currents I1, I2 are constant but are low. At the end of the state Z7, the current I2 reaches a negative maximum when a tapping 25 is present. Thus, in the state Z8, when both switching elements 18, 19 are switched off, a voltage is induced so that the center M2 is drawn to the positive potential 12 of the DC power supply 100. The switching element 18 is therefore able to switch on without voltage in the state Z9. The states Z9 to Z12 correspond to the states Z1 to Z4. It should be noted that the current IC corresponds to the sum of the currents I2 and I2.

Figure 9:
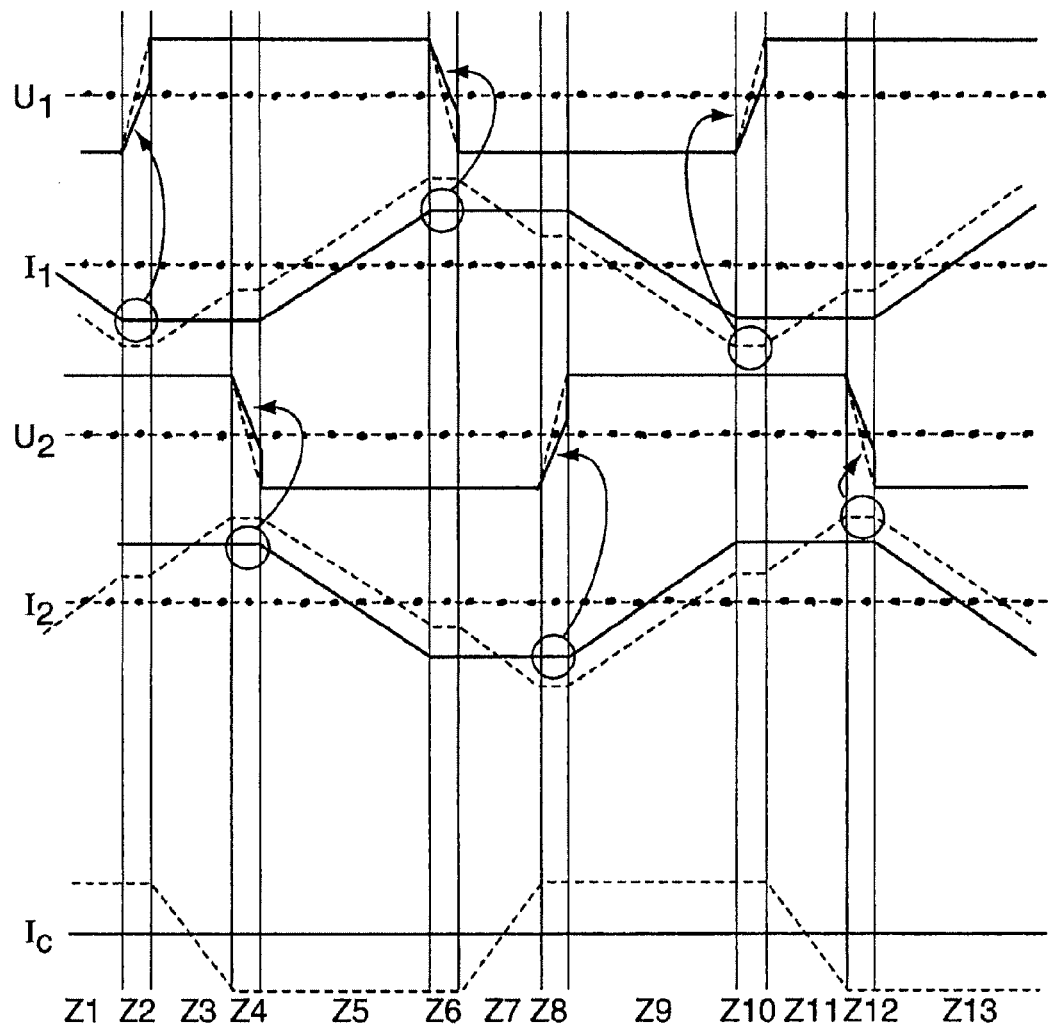
FIG. 9 is a graph illustrating the behavior of a switch bridge at a phase shift of 120°.

FIG. 9 shows a graph which represents a phase shift of 120°. In the state Z1, the center M1 is on the negative potential 13 of the DC power supply 100 and the center M2 is on the positive potential 12 of the DC power supply 100. In the state Z2, the switching elements 15, 16 of the half bridge 14 are switched off. The center M1 is not therefore connected to the DC power supply 100. In the state Z3, the centers M1, M2 are connected to the positive 12 of the DC power supply 100. In the state Z4, the switching elements 18 and 19 of the second half bridge 17 are switched off so that the center M2 is not connected to the DC power supply 100. In the state Z5, the center M1 is connected to the positive DC power supply 100 and the center M2 is connected to the negative potential 13 of the DC power supply 100. In the state Z6, the switching elements 15, 16 are switched off so that the center M1 is not connected to the DC power supply 100. The center M2 is connected to the negative potential 13 of the DC power supply 100. In the state Z7, the centers M1 and M2 are connected to the negative potential 13 of the DC power supply 100. In the state Z8, the switching elements 18 and 19 are switched off so that the center M2 is no longer connected to the DC power supply 100. The center M1 is connected to the negative potential of the DC power supply 100. The state Z9 corresponds to the state Z1.

The action of the central tapping 25 is visible during the states Z2, Z4, Z6, Z8, Z10 and Z12. Whilst only one voltage change of approximately two thirds of the voltage difference between positive and negative potential of the DC power supply 100 takes place in the absence of a central tapping, a higher voltage is induced due to the current flowing via the tapping 25, so that during the state Z2 a voltage jump of voltage U1 takes place from the negative potential 13 of the DC power supply 100 to the positive potential 12 of the DC power supply 100 so that at the beginning of the state Z3, the switching element 15 is able to switch on without voltage. Correspondingly, the voltage U2 is brought from the positive potential 12 of the DC power supply 100 to the negative potential 13 of the DC positive potential device during the state Z4 when the tapping 25 is present, so that at the beginning of the state Z5, the switching element 19 is able to switch on without voltage. During the state Z6, the voltage U1 is brought from the positive potential 12 of the DC power supply 100 to the negative potential 13 if the central tapping is provided.

In comparison to this, the negative potential 13 is not reached if there is no tapping 25, so that at the beginning of the state Z7, the connection takes place under voltage. In the state Z8, the voltage U2 is brought from the negative potential 13 of the DC power supply 100 to the positive potential 12 of the DC power supply 100 due to the induction. If there is no tapping, only a small voltage jump is executed, so that in the state Z9, the connection takes place under voltage. The current IC is in turn the sum of the currents I1 and I2.

What is claimed is:

1. A plasma supply device comprising:
   a full bridge circuit connectable to a DC power supply, the full bridge including two half bridges, each half bridge including two switching elements connected in series via a center between the switching elements; and
   a power transformer with a primary winding connected to the centers of the half bridges,
   wherein the primary winding comprises a tapping connectable to a potential between two potentials of the DC power supply.

2. The plasma supply device of claim 1, wherein the tapping of the primary winding is provided in the center of the primary winding.

3. The plasma supply device of claim 1, further comprising a voltage divider and wherein two ends of the voltage divider are connectable to the two potentials of the DC power supply and a third connection of the voltage divider is connected to the tapping.

4. The plasma supply device of claim 3, wherein the voltage divider comprises at least one resistor and/or capacitor.

5. The plasma supply device of claim 1, further comprising a first inductance or a capacitor connected to the tapping and connectable to an alternating current center of the DC power supply.

6. The plasma supply device of claim 1, further comprising an oscillatory circuit connected to the tapping and connectable to an alternating current center of the DC power supply.

7. The plasma supply device of claim 1, further comprising an auxiliary inductance between at least one of the centers of the half bridges and at least one connection of the primary winding.

8. The plasma supply device of claim 1, further comprising an auxiliary inductance connected in parallel to the primary winding.

9. The plasma supply device of claim 1, wherein the plasma supply device is configured for operation at frequencies of at least 3 MHz and a DC power supply voltage larger than 100 V.

10. The plasma supply device of claim 1, wherein a power larger than 10 kW can be generated with the plasma supply device.

11. A method for operating a plasma supply device including a DC power supply, a full bridge with four switching elements, and a power transformer connected to the full bridge and including a primary winding with a tapping, the method comprising:
zero-voltage switching of at least some of the switching elements;
regulating a power by phase shifting;
providing an alternating current center between the potentials of the DC power supply; and
applying the alternating current center to the tapping of the primary winding.

12. The method of claim 11, wherein the tapping is located at a center of the primary winding.

13. The method of claim 11, wherein the alternating current center is applied via a coil or an oscillatory circuit to the tapping.

14. The method of claim 11, wherein the alternating current center is provided by a voltage divider including capacitors.

15. The method of claim 14, wherein bypass capacitors of the half bridges forming the full bridge are used as the voltage divider.

16. The method of claim 11, wherein a power greater than 10 kW is generated.

17. A system comprising:
a DC power supply; and
a plasma supply device including a full bridge circuit connected to the DC power supply, the full bridge including two half bridges, each half bridge including two switching elements connected in series via a center between the switching elements, and a power transformer with a primary winding connected to the centers of the half bridges,
wherein the primary winding comprises a tapping connected to a potential between two potentials of the DC power supply.

18. The system of claim 17, wherein the plasma supply device further comprises a voltage divider and wherein two ends of the voltage divider are connectable to the two potentials of the DC power supply and a third connection of the voltage divider is connected to the tapping.

19. The system of claim 18, wherein the voltage divider comprises at least one resistor and/or capacitor.

20. The system of claim 17, wherein the plasma supply device further comprises an oscillatory circuit connected to the tapping and connectable to an alternating current center of the DC power supply.

* * * * *